United States Patent [19]

Beatty et al.

[11] Patent Number: 4,637,924

[45] Date of Patent: Jan. 20, 1987

[54] CONTINUOUS SILICON CARBIDE WHISKER PRODUCTION

[75] Inventors: Ronald L. Beatty, Greer; Floyd H. Wyman, Mauldin, both of S.C.

[73] Assignee: Atlantic Richfield Company, Los Angeles, Calif.

[21] Appl. No.: 686,780

[22] Filed: Dec. 27, 1984

Related U.S. Application Data

[63] Continuation of Ser. No. 331,331, Dec. 16, 1981, abandoned.

[51] Int. Cl.$^4$ ............................................. C01B 31/36
[52] U.S. Cl. ..................................... 423/345; 422/232
[58] Field of Search ........................ 423/345; 422/232

[56] References Cited

U.S. PATENT DOCUMENTS

| | | | |
|---|---|---|---|
| 3,271,109 | 9/1966 | Mezey et al. | 423/345 |
| 4,284,612 | 8/1981 | Horne et al. | 423/345 |
| 4,504,453 | 3/1985 | Tanaka et al. | 423/345 |

FOREIGN PATENT DOCUMENTS

| | | | |
|---|---|---|---|
| 544597 | 8/1957 | Canada | 423/345 |
| 655798 | 1/1963 | Canada | 422/232 |
| 51-59800 | 5/1976 | Japan | 423/345 |
| 53-66898 | 6/1978 | Japan | 423/345 |

*Primary Examiner*—William R. Dixon, Jr.
*Assistant Examiner*—Steven Capella
*Attorney, Agent, or Firm*—Craig E. Larson

[57] ABSTRACT

The invention features methods and apparatus for obtaining silicon carbide whiskers on a continuous basis. Rice hulls or other carbon and silicon containing feed materials are continuously fed to a conversion zone in an unagitated state in order to promote whisker growth. The conversion zone is continuously purged, preferably with an inert gas such as nitrogen. The purging gas is vented directly out of the conversion zone and carries away gaseous reaction products and impurities, prevents oxidation of the whiskers and keeps glasses from condensing and depositing on the furnace surfaces. The feed materials are fed in a dry state to the conversion zone in order to prevent erosion of the furnace walls. After conversion and cooling the whiskers are separated from the mass of particulate silicon carbide. The whiskers find use as reinforcements.

12 Claims, 3 Drawing Figures

CONTINUOUS SILICON CARBIDE WHISKER PRODUCTION

CROSS-REFERENCE TO RELATED APPLICATION

This application is a continuation of application Ser. No. 06/331,331, filed Dec. 16, 1981, abandoned.

FIELD OF THE INVENTION

This invention pertains to the production of silicon carbide whiskers and more particularly to a continuous process for obtaining silicon carbide whiskers from feed materials containing silicon and carbon.

BACKGROUND OF THE INVENTION

Heretofore, the production of silicon carbide whiskers has always been achieved by batch processing methods. In one known process, rice hulls, a throw-away byproduct of rice refining, are known to contain both silicon dioxide and carbon in sufficient amounts to produce silicon carbide as taught in U.S. Pat. No. 3,754,076. Rice hulls are generally batch heated in an induction furnace to temperatures in the general range of 1600° C. to 2000° C. for several hours. During this time, the silicon and carbon combine to form a cake of both silicon carbide particles and silicon carbide whiskers. The whiskers are removed and separated from the cake by well known methods, such as froth flotation, as described in U.S. Pat. No. 4,293,099.

Silicon carbide whiskers can also be made by the batch heating of organic fibers blended with silica at temperatures of 1400° C. to 1700° C. as shown in U.S. Pat. No. 4,284,612.

These whiskers find important uses in the reinforcement of metals, plastics and ceramics.

It has been known that silicon carbide particles (as distinguished from whiskers) for use as abrasives can be produced in a continuous process. Canadian Pat. No. 544,597 shows a process in which mixtures of coke, sand and salt (the latter apparently as a catalyst) are moved through a furnace. The mass of materials moves about and expands substantially as the coke and sand react to form blocky SiC crystals. Exhaust gases evolved from the reaction are removed at the inlet end of the furnace. However, attempts to produce whiskers in continuous processes have not heretofore been successful. The reaction does not easily lend itself to continuous production methods, because continuous feeding of the coked rice hulls or other raw materials agitates the reactants, thus inhibiting the growth of the whiskers.

Attempts have been made by the present inventors to feed these materials on a continuous batch basis. Cylindrical graphite containers filled with coked rice hulls were pushed in a sequential manner through a heating zone. These graphite containers were used to maintain the feed materials in an unagitated state, while continuously traveling through a conversion furnace.

This initial process failed after several days of continuous operation. Analysis of the problem revealed that gaseous impurities emitted during the conversion process were condensing and forming glass-like deposits on the furnace and exit walls in areas whose temperatures generally fell below 1500° C. These glass-like deposits prevented the movement of the graphite containers, i.e., the deposits formed a friction surface against which the containers could not be fed.

Further, a problem was noted with moisture in the feed materials. Moisture present at temperatures necessary for whisker formation has the ability to erode furnace wall.

BRIEF SUMMARY OF THE INVENTION

These two problems were resolved by utilizing a novel split purge technique. Feed materials containing silicon and carbon are continuously fed through a series of zones (or "furnaces"): dehydrating, conversion and cooling. The feed materials are passed through the conversion and cooling. The feed materials are passed through the conversion stage in a substantially unagitated state in order to promote the growth of whiskers. Inert gas is continuously forced into a heating chamber between adjacent dehydrating and conversion furnaces, such that: (1) the inert gas flows upstream through the dehydrating furnace to prevent moisture from traveling through the adjacent conversion furnace; and (2) the inert gas flows downstream through the conversion furnace to purge the gaseous impurities from the furnace before they can deposit on cooler surface areas.

The purging technique requires that the inert gas be pumped through the system under a constant head of pressure. Also, the exhaust gas pipes are constructed so as to vent directly from the conversion zone, so that hot reactive gasses evolved never reach or deposit as a film upon cooler surfaces.

The exhaust flue pipes can be constructed for quick detachment from the conversion furnace wall, so that continuous operation need not be interrupted during cleaning and maintenance procedures.

It is also contemplated by this invention to employ continuous systems designed about a continuous hearth or a continuous tunnel kiln. The continuous hearth system utilizes a continuously moving, one piece, annular, horizontal surface for carrying coked rice hulls through the various zones. The annular surface is made of a material having the capacity to withstand the conversion temperature of between approximately 1000° C. and 2000° C. Such a material can comprise a one piece, annular slab of graphite.

The tunnel kiln system comprises miniature graphite cars, which roll upon sets of wheels through the zones, or containers carried on a sliding surface, rollers, a walking beam, or other conveying means, all of which will be designed to operate in a manner which does not impart significant agitaion to the reactants.

While it is presently preferred to use the process employing cylindrical graphite containers, the continuous method of the invention is not meant to be limited by any particular apparatus or system design; the preferred and suggested embodiments are exemplary in nature and are meant only as a teaching of how the inventive method may be accomplished.

To the best of our knowledge and belief, this is the first time anyone has suggested or described a process or processes for producing silicon carbide whiskers on a continuous or substantially continuous basis. It is, therefore, believed that this invention makes a significant contribution to the art of silicon carbide whisker production.

It is an object of the invention to provide methods and apparatus for continuously producing silicon carbide whiskers.

It is another object of this invention to provide improved methods and apparatuses for increasing the throughput of silicon carbide whisker production..

These and other objects of this invention will be better understood and will become more apparent with reference to the following detailed description of the invention, considered in conjunction with the accompanying drawings described below.

DETAILED DESCRIPTION OF THE INVENTION

Figure 1:
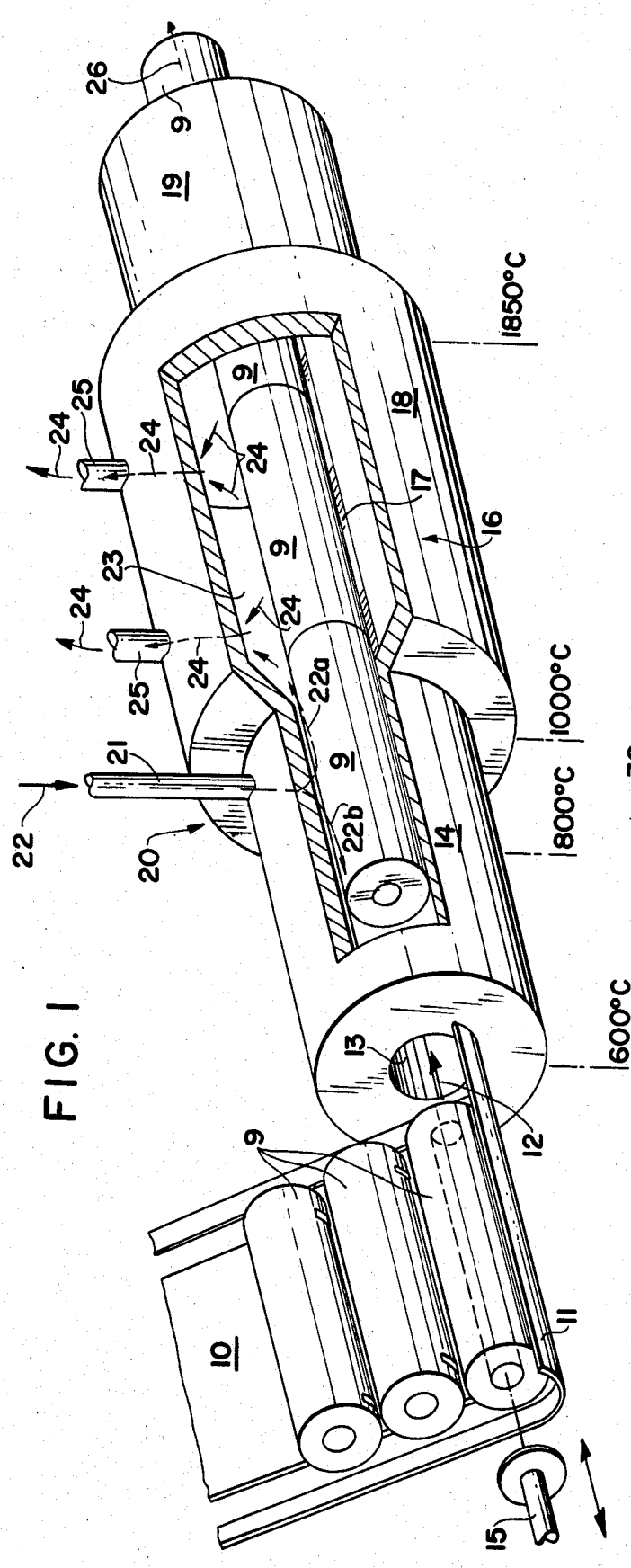
FIG. 1 is a schematic perspective view of a continuous bulk feed system for the production of silicon carbide whiskers in accordance with the invention described herein.

For purposes of this invention, the terms "whiskers" or "silicon carbide whiskers" shall be defined as silicon carbide fibers, filaments or particles, or mixtures thereof, which are produced by a method or methods herein disclosed or suggested.

For purposes of this invention the terms "continuous" or "substantially continuous" are synonymous, and include a process which can be interrupted, or which allows for indexing or sequential movement of materials.

The invention relates to methods and apparatus for producing silicon carbide whiskers on a continuous or substantially continuous basis. Feed materials containing silicon and carbon are fed in an unagitated state and, in a substantially continuous fashion through a heating zone at a temperature and for a time sufficient to promote whisker growth. It is important to feed the materials in an unagitated state, in order to promote the growth of silicon carbide whiskers. When agitated, the feed materials do not effectively form long fibrous whiskers; rather the reaction products are the blocky abrasive particles of the type illustrated in the aforementioned Canadian patent.

The materials containing silicon and carbon can be rice hulls (which may be coked), a mixture of petroleum distillate and sand, etc. The process is not generally dependent upon the feed materials for its novelty, although coked rice hulls are preferred. For convenience, the description of the process set forth below will be exemplified by rice hulls.

The feed materials are first dehydrated in a dehydrating zone, wherein at least 99% of the water (by weight) is removed. Preferably most, if not all, of the moisture is removed to prevent erosion of the walls of the adjacent converting zone furnace.

The dried materials enter and are passed through the converting zone for a time in excess of one hour at a temperature in excess of 1000° C. The converting zone generally features a temperature range of from approximately 1000° C. to 1850° C. The converting zone is substantially continuously purged with a gas to drive off the gaseous impurities generated during whisker formation. The impurities are directly vented from the converting zone to prevent glass-like deposits from forming on cool surfaces, i.e., surfaces below 1500° C.

The purging gas preferably comprises an inert gas, such as nitrogen or argon. Other purging gases, or mixtures of purging gases, can be used, as long as they do not have a detrimental effect on the reactants, products or apparatus. It is also possible to use as a purging gas a reactive gas which enhances whisker growth or selected properties. The purging gas is usually introduced at the juncture between the dehydrating zone and the adjacent converting zone. The purging gas is split into two flow streams, such that part of the gas travels upstream through the dehydrating zone. This prevents the extracted moisture from entering the heating zone. The other portion of the purging gas is forced downstream into the converting zone, so as to drive off the aforementioned gaseous impurities.

The ports or vent pipes for discharging the gaseous impurities can be designed to be easily disconnected from the converting zone's furnace wall for the purpose of maintaining and cleaning these pipes.

Adjacent the converting zone, on the downstream side thereof, is a cooling zone for cooling the whiskers to ambient temperature without oxidation.

The apparatus for accomplishing the inventive process can be designed as a continuous bulk feed system or tunnel kiln having a number of containers or vessels moving in tandem through the various zones. The containers or vessels can be moved through the various zones by pushing on a sliding surface or by rollers, rail cars, a walking beam or other conveying means.

The apparatus can also be designed as a continuous rotary hearth system having a one piece annular belt which carries the feed materials through the heating states.

Now referring to FIG. 1, a continuous bulk feed system is shown. Rice hulls or other suitable silicon and carbon-containing materials are loaded into a number of cylindrical containers 9 which are stacked on a tray 10. Each cylinder is comprised of graphite material to withstand the high temperatures required for silicon carbide whisker growth. The bottom container 9 in the bottom curved portion 11 of tray 10 is pushed (arrow 12) into the mouth 13 of a dehydrating zone or furnace 14 by ram 15. After the bottom cylinder 9 is pushed into the zone 14, the ram 15 is retracted and the other cylinders 9 on tray 10 are each lowered (indexed) one cylinder width, such that a new cylinder 9 is then ready to be pushed into the dehydration zone 14.

The cylinders are each loaded with about five pounds of material.

The ram 15 pushes the cylinders 9 at a rate of approximately five feet per hour through the system.

Each cylinder 9 pushes the next cylinder ahead of it, such that there is a continuous succession of cylinders 9 traveling through the system, as shown in the cutaway section of the system by arrow 16.

The dehydrating zone 14 has a temperature range from approximately 600° C. at its entrance to approximately 800° C. at its exit, as shown.

The dehydrating zone 14 drives off most, if not all, of the moisture in the rice hull materials, so that the moisture will not erode the furnace walls 17 of the subsequent conversion zone or furnace 18.

After the rice hulls have been dried in the dehydrating zone 14, they enter the conversion zone of furnace 18, where whisker growth occurs. The conversion zone 18 is a high temperature heating zone, wherein the silicon and carbon react to form silicon carbide. The materials traveling must move through the converting zone in an unagitated state, in order to promote the growth of the whiskers.

The conversion zone 18 subjects the dried rice hulls to temperatures in the range of approximately 1000° C.

at its entrance to approximately 1850° C. at its exit. These temperatures are sufficient to promote whisker growth. The zone 18 is heated by an electrode receiving approximately 15 volts and 5000 amperes.

Each container 9 takes approximately one or two hours to travel through each zone of the system. Each furnace or zone (dehydrating, conversion, etc.) has a length of approximately 10 feet and therefore requires about two hours for a complete passage of each container at a speed of 5 feet per hour. These zone lengths and speeds are variable, depending upon the amount of materials passing through the system and the dimensional scale of the system.

After the whiskers have been formed in the conversion zone 18, the containers enter a cooling zone 19. This cooling zone 19 reduces the temperature of the whiskers and containers back to ambient. This cooling takes place in an atmosphere which will prevent oxidation of the whiskers and containers as they cool.

At the juncture (arrow 20) between the dehydrating furnace 14 and the conversion furnace 18 is situated a gas inlet 21. Gas is constantly pumped through inlet 21 (arrow 22) into the inner chamber 23 of each furnace, i.e., the gaseous flow is split into two streams 22a and 22b, respectively. Stream 22a flows downstream into the conversion zone 18 and purges this zone of gaseous impurities evolving from the reaction of the rice hulls. These gaseous impurities are caused to flow (arrows 24) to the vents 25 which are located directly in the conversion zone. The location of vents 25 is critical. If the gaseous impurities cool below 1500° C., they will condense and solidify into a glass-like substance which can impair the operation of the furnace by causing a frictional drag upon the containers. Thus the movement of containers will be impeded. Also, this glass-like substance can clog the vents and other furnace parts.

The vents 25 must be located directly in the conversion zone in order to insure that the gaseous impurities are purged from the system before solidification can occur.

Vents 25 can be designed to easily disconnect from the furnace 18 for purposes of cleaning or repairing the vents 25 without the need for interrupting the operation of the system.

The purging gas is fed to the system at a continuous rate of 50 to 100 cubic feet per hour. The purging gas can be an inert gas such as nitrogen or argon, or another gas to promote whisker growth. Also, a mixture of gases may be used, one of which may be inert.

The stream 22b of the purging gas flows upstream into the dehydrating zone 14 and carries the extracted moisture way from the conversion zone 18. This prevents the moisture from entering and eroding the furnace walls in the conversion furnace.

The containers 9 exit from the cooling chamber 19 as shown by arrow 26. The product whiskers contained in the containers 9 can now be removed from the containers and separated from the cake of silicon carbide particles by solid-liquid extraction.

Figure 2:
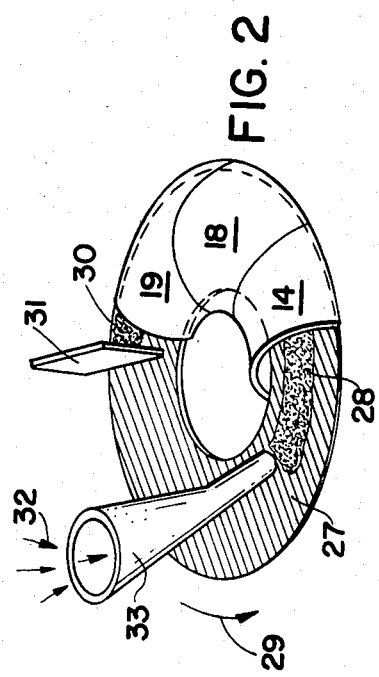
FIG. 2 is a schematic perspective view of an alternative appartus to FIG. 1, using a rotary hearth system.

Referring to FIG. 2, a continuous apparatus for producing silicon carbide whiskers is illustrated in schematic. The apparatus of FIG. 2 features a rotary hearth system. The rotary hearth system has the same dehydrating zone 14, conversion zone 18, and cooling zone 19 as does the apparatus of FIG. 1. These zones are purged with inert gas 22 in similar fashion as the system of FIG. 1.

The difference between the rotary hearth and the bulk feed system is a continuous feed of loose materials through the system. This is accomplished by a continuously rotating (arrow 29) annular, one piece belt or slab 27 of graphite which carries the rice hull material 28 through the processing zones 14, 18 and 19, respectively. The slab 27 is caused to rotate by a number of drive rollers (not shown).

The whisker material 30 emerging from the cooling zone 19 is scraped from the slab 27 by a knife edge or blade 31.

The raw stock (e.g., rice hulls) may be gravity fed (arrows 32) to the rotating slab 27 by a funnel-shaped chute 33, as shown.

Figure 3:
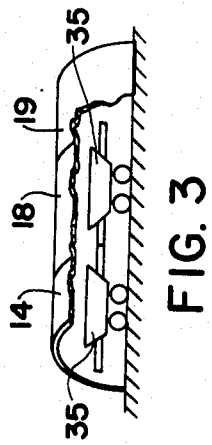
FIG. 3 is a schematic cutaway view of another alternative apparatus to FIG. 1, utilizing a tunnel kiln system.

Referring to FIG. 3, a tunnel kiln system is schematically illustrated. In this system, a series of railway cars 35 are rolled through zones 14, 18 and 19, respectively. Each railway car is filled with coked rice hulls or similar materials prior to entering the processing zones. Each railway car 35 is tip-unloaded at the exit of zone 19. All other operational conditions are similar to those described for FIGS. 1 and 2. The railway cars 35 may be loaded by a funnel-shaped chute (not shown) similar to that shown in FIG. 2.

EXAMPLE

The following example is an actual account of material being processed by the apparatus and system depicted in FIG. 1. Coked rice hulls were placed in graphite containers and fed continuously into a silicon carbide converter system. The coked rice hulls were fed at a rate of six pounds per hour. The converter system comprised a preheater/dryer section, a high temperature converter section, and a cooling section. The preheater/dryer section heated the coked rice hulls to a temperature of 800° C. with a residence time of 1.5 hours to remove moisture. This section was purged with nitrogen and separately vented to prevent moisture from entering the high temperature converter section. The preheater containment was an Inconel muffle heated externally be electric resistance furnaces. The converter section heated the coked hulls under nitrogen purge by direct low voltage resistance heating of a graphite muffle to a temperature ranging from 1500° C. at the entrance to 1800° C. at the exit with a residence time of 1.5 hours in the 1500°–1800° C. range. This section was vented out the side to exhaust the purge gas and reaction product gases including carbon monoxide and other volatile products. The cooling section was a water-cooled shell purged with argon which cooled the containers and converted material to ambient temperature during a residence time of 1.5 hours. The converted material product was produced at a rate of 2.5 pounds per hour, and comprised approximately 15% silicon carbide whsikers, 60% silicon carbide particles, and 25% residual carbon.

Having thus described the invention, what is desired to be protected by Letters Patent is presented by the appended claims.

What is claimed is:

1. A method of obtaining silicon carbide whiskers on a substantially continuous basis from feed materials comprising carbon and silicon, comprising the steps of:
   (a) substantially continuously feeding to a dehydrating zone materials comprising carbon and silicon and producing dehydrated materials which have a water content by weight of less than approximately one percent of the total composition of said materials;

(b) substantially continuously feeding the dehydrated materials formed in step (a) to a conversion zone;

(c) substantially continuously passing said dehydrated materials in an unagitated state through said conversion zone at temperatures of above approximately 1000° C. for a time sufficient for a portion of said materials to react to form silicon carbide whiskers;

(d) substantially continuously purging said conversion zone of gaseous reaction products; and (e) exhausting said gaseous reaction products directly from said conversion zone before said products deposit on the interior surfaces of said zone or any adjacent processing zones.

2. The method of claim 1 wherein said step (d) comprises introducing purging gas at a point between said conversion zone and said dehydrating zone and causing one portion of said purging gas to flow into said conversion zone and the remaining portion of said purging gas to flow into said dehydrating zone.

3. The methods of claims 1 or 2 further comprising the step of:

(f) cooling said heated materials back to ambient temperature after steps (c) and (d).

4. The methods of claims 1 or 2 wherein the reaction in step (c) occurs in the presence of a gaseous atmosphere which is inert or enhances the growth or properties of said whiskers.

5. The method of claim 4 wherein said atmosphere is inert.

6. The method of claim 5 wherein said inert atmosphere comprises nitrogen or argon.

7. The method of claims 1 or 2 wherein said feed materials comprise rice hulls.

8. The method of claims 1 or 2 wherein said feed materials comprise sand and at least one petroleum distillate.

9. The method of claims 1 or 2 wherein said materials remain in said converting zone for a time in excess of 1 hour.

10. The method of claims 1 or 2 wherein said materials are heated in said converting zone in a temperature range from approximately 1000° C. to 1850° C.

11. The method of claims 1 or 2 wherein said gaseous reaction products are withdrawn from said conversion zone while their temperature is above their condensation temperature.

12. The method of claim 1 wherein said gaseous reaction products are withdrawn when their temperature is at least about 1500° C.

* * * * *